(12) United States Patent
Lips

(10) Patent No.: US 10,788,559 B2
(45) Date of Patent: Sep. 29, 2020

(54) MOTION DETECTION WITH MULTI ELEMENT RADIO FREQUENCY ANTENNAS

(71) Applicant: KONINKLIJKE PHILIPS N.V., Eindhoven (NL)

(72) Inventor: Oliver Lips, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 283 days.

(21) Appl. No.: 15/574,264

(22) PCT Filed: May 18, 2016

(86) PCT No.: PCT/EP2016/061165
§ 371 (c)(1),
(2) Date: Nov. 15, 2017

(87) PCT Pub. No.: WO2016/188826
PCT Pub. Date: Dec. 1, 2016

(65) Prior Publication Data
US 2018/0143283 A1    May 24, 2018

(30) Foreign Application Priority Data

May 27, 2015 (EP) .................................. 15169440

(51) Int. Cl.
*G01R 33/56* (2006.01)
*G01R 33/565* (2006.01)

(52) U.S. Cl.
CPC ... *G01R 33/56509* (2013.01); *G01R 33/5608* (2013.01)

(58) Field of Classification Search
CPC ............ G01R 33/341; G01R 33/56375; G01R 33/56383; G01R 33/56391
(Continued)

(56) References Cited

FOREIGN PATENT DOCUMENTS

CN   102324959 B  * 10/2013  ............... H04B 7/06

OTHER PUBLICATIONS

Espacenet translation CN102324959 (B) Frequency spectrum sensing method based on multi-aerial system covariance matrix (Year: 2012).*

(Continued)

*Primary Examiner* — Melissa J Koval
*Assistant Examiner* — Courtney G McDonnough

(57) ABSTRACT

The invention provides for an instrument (100, 300) comprising: a radio-frequency antenna (102) comprising multiple antenna elements (104); a radio-frequency system (106) comprising independent receive channels for receiving a radio-frequency signal (140) from each of the multiple antenna elements; a memory (130) containing machine executable instructions (160, 162); and a processor (124) for controlling the instrument. Execution of the machine executable instructions causes the processor to: control (200) the radio-frequency system to receive the radio frequency signal from each of the multiple antenna elements; extract (202) a noise signal (142) from the radio frequency signal from each of the multiple antenna elements; calculate (204) a normed signal (144) for each noise signal by applying a mathematical norm to each noise signal; calculate (206) a covariance (146) of the normed signal between each of the multiple antenna elements; calculate (208) a motion signal (148) by summing each covariance of the normed signal; and detect (210) motion of a subject by detecting a motion event (150) in the motion signal.

17 Claims, 12 Drawing Sheets

(58) Field of Classification Search
USPC .......................................................... 324/309
See application file for complete search history.

(56) References Cited

OTHER PUBLICATIONS

Andreychenko et al "Noise Variance of an RF Receive Array Reflects Respiratory Motion: A Novel Respiratory Motion Predictor" Proc. Intl. Soc. Mag. Reson. Med 22 (2014) p. 0092.
Tian et al "Effects of Motion on Coupling of Coil Elements and Parallel Imaging Reconstruction at 3T and 7T" Proceedings of the International Society for Magnetic Resonance in Medicine, May 15, 2015, p. 2419.
Navest R. et al.: "Predictive sensor for Real-time respiratory motion monitoring",International Society for Magnetic Resonance in Medicine, ISMRM, 2030 Addison Street, 7th Floor, Berkeley, CA 94704 USA, May 15, 2015 (May 15, 2015), p. 0814.
Navest R. et al.: "Cardiac activity detection with the noise variance of a receive coil".Proceedings of the International Society for Magnetic Resonance in Medicine, 13rd Annual Meeting & Exhibition, May 15, 2015 (May 15, 2015), p. 2583.
Ding Y. et al: "Accurate Noise Level and Noise Covariance Matrix Assessment in Phased Array Coil Without a Noise Scan",ISMRM-ESMRMB Joint Annual Meeting Proceedings, May 1, 2010 (May 1, 2010), p. 648.
Kellman P et al: "Image reconstruction in SNR Units: a general method for SNR measurement", Magnetic Resonance in Medicine Wiley USA,vol. 54, No. 6, Dec. 2005 (Dec. 2005), pp. 1439-1447.
Gong E. et al.: "Motion Estimation from Noise Intrinsic Correlation between RF Channels (MECHANICS)", Proceedings of the International Society for Magnetic Resonance in Medicine, 23rd Annual Meeting & Exhibition, May 15, 2015 (May 15, 2015), p. 3671.
Andreychenko A. et al.: "Spatial Motion Model Driven by the noise covariance matrix of a receive array", Proceedings of the International Society for Magnetic Resonance in Medicine, 23rd Annual Meeting & Exhibition, May 15, 2015 (May 15, 2015), p. 0097.
D. Buikman, T. Helzel, and P. Röschmann. The rf coil as a sensitive motion detector for magnetic resonance imaging. Magn Reson Imaging, 6(3):281-289, 1988.

* cited by examiner

MOTION DETECTION WITH MULTI ELEMENT RADIO FREQUENCY ANTENNAS

CROSS REFERENCE TO RELATED APPLICATIONS

This application is a U.S. national phase application of International Application No. PCT/EP2016/061165, filed on May 18, 2016, which claims the benefit of EP Application Serial No. 15169440.3 filed on May 27, 2015 and is incorporated herein by reference.

TECHNICAL FIELD OF THE INVENTION

The invention relates to the detection of motion using multiple antenna elements.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the BO field.

During an MRI scan, Radio Frequency (RF) pulses generated by a transmitter coil or antenna causes perturbations to the local magnetic field, and RF signals emitted by the nuclear spins are detected by a receiver coil. These RF signals are used to construct the MRI images. Movement of a subject during a MRI procedure can cause artifacts or errors in the resulting image.

The publication Andreychenko et. al., "Noise variance of an RF receive array reflects respiratory motion: a novel respiratory motion predictor," Proc. Intl. Soc. Mag. Reson. Med. 22 (2014) pp. 0092 discloses that the thermal noise variance of an MRI RF coil can effectively pick up respiratory motion.

SUMMARY OF THE INVENTION

The invention provides for an instrument, a computer program product and a method in the dependent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for an instrument comprising a radio-frequency antenna comprising multiple antenna elements. The instrument further comprises a radio-frequency system comprising independent receive channels for receiving a radio-frequency signal from each of the multiple antenna elements. Each of the multiple antenna elements is therefore able to receive a separate or independent radio-frequency signal. The instrument further comprises a memory containing machine-executable instructions. The instrument further comprises a processor for controlling the instrument. For example the processor may be able to receive digitized or otherwise recorded data from the radio-frequency signal. If the instrument comprises other components such as a magnetic resonance imaging system or other instrumentation or apparatus the processor may be able to control these additional components also.

Execution of the machine-executable instructions causes the processor to control the radio-frequency system to receive the radio-frequency signal from each of the multiple antenna elements. It is understood that the radio-frequency signal is in the form of data which can be stored or manipulated by the processor. Execution of the machine-executable instructions further causes the processor to extract a noise signal from the radio-frequency signal from each of the multiple antenna elements. The extraction process may be different in different types of instruments. For example if the instrument incorporates a magnetic resonance imaging system the noise signal may for instance incorporate or be extracted from magnetic resonance data.

If the instrument only comprises the multiple antenna elements and the radio-frequency system as the only RF or radio components then extracting the noise signal may only include some sort of signal processing which is applied to the radio-frequency signal. For example a filtering or data fitting step may be performed to extract the noise signal. Execution of the machine-executable instructions further cause the processor to calculate a norm signal for each noise signal by applying a mathematical norm to each noise signal. In mathematics a norm is a function that assigns a positive length or value to or sized each vector in a vector space. If the noise signal is real valued then the mathematical norm would map negative and positive values to a positive normed signal. If the noise signal is complex valued then the complex value of the noise signal would be mapped to a positive value. The concept of a mathematical norm is well known in the linear algebra and functional analysis.

Execution of the machine-executable instructions further cause the processor to calculate a covariance of the norm signal between each of the multiple antenna elements. By calculating the covariance of the norm signal between each of the multiple antenna elements it is understood that the covariance is calculated between different antenna elements. Execution of the machine-executable instructions further cause the processor to calculate a motion signal by summing each covariance of the normed signal. Execution of the machine-executable instructions further cause the processor to detect motion of a subject by detecting a motion event in the motion signal. The motion event may be a value or series of values in the motion signal which indicate motion of the subject.

This embodiment may be beneficial because the instrument may provide a proved method of detecting motion of a subject or object which is in proximity to the multiple antenna elements of the radio-frequency antenna. When looking at a radio-frequency signal received by the multiple antenna elements the radio-frequency system will receive thermal noise. An object in proximity to the multiple antenna elements will couple to the multiple antenna elements and when it moves it may cause a change in the amplitude of the mean noise. Calculating the mathematical norm is a means of detecting changes in the amplitude of the noise signal. If a large object such as a subject moves and is in proximity to multiple antenna elements then a change or jump in the mean noise amplitude will be in more than one of the multiple antenna elements. Calculating the covariance of the norm signal will differentiate between random thermal noise and movement which causes a global or a change in multiple antenna elements. By summing the covariance of the norm signal for each of the multiple antenna elements a real valued parameter, which is named the motion signal here can be used to readily detect motion of the subject. Various methods such as thresholding or applying protection methods such as the change or derivative of the motion signal can be used to indicate motion of the subject accurately.

The noise signals detected by each of the multiple antenna elements comprise discreet values and can be correlated in time. This thermal background noise in the multiple antenna elements may also be known as Johnson-Nyquist noise. In each of the multiple antenna elements the noise does not have to be from the same source but is related. For example if the multiple antenna elements were placed near the different parts of the head, different parts of the head may affect different coil elements differently as the head moves. The noise of the different antenna elements is therefore related but is not caused by exactly the same body parts or exactly the same source.

In some embodiments the antenna elements can have a fixed or predetermined geometry with respect to each other. An example would be the various elements in a head coil used for magnetic resonance imaging.

In another embodiment each of the multiple antenna elements has a bandwidth. The memory further contains a digital filter algorithm for each of the multiple antenna elements that functions as an inverse function to the bandwidth. Execution of the instructions further causes the processor to apply the digital filter to the radio-frequency signal before or while processing the radio-frequency signal into the noise signal. This embodiment has the effect of reversing the effect of the bandwidth of the antenna element and the radio-frequency system. The effect of the filter is to transform the noise back into white noise. In some examples, using this filter may also have the additional benefit that this may correct the number of degrees of freedom in the noise.

When applying digital filters to the noise signal the filter may be modified such that it automatically corrects for the bandwidth characteristics of the antenna and/or the radio-frequency system.

In another embodiment execution of the machine-executable instructions further causes the process to set portions of each covariance of the norm signals to zero that are below a predetermined threshold before calculating the motion signal. This may be beneficial because if there is a low correlation between signals then the covariance of the norm signals will be low. By setting these low values to zero it helps to reduce the likelihood that motion of the subject is incorrectly detected.

In another embodiment execution of the machine-executable instructions further cause the processor to apply a weighting factor to each of the covariance of the norm signals before calculating the motion signal. The weighting factors can for example be standard deviations of the signal. For example transforming the covariance to a correlation coefficient, a probability density function or measuring probability as in measuring a certain standard deviation for the value within a certain time window and other functions may also be envisaged. This may have the benefit of putting an emphasis on events which are less probably a purely stochastic function in the signal. Due to the stochastic nature of the signals fluctuations are expected to occur in the signal.

In another embodiment execution of the machine-executable instructions further cause the processor to normalize each norm signal using the mean value before calculating the motion signal. This embodiment may be beneficial because it may put the final motion signal in a better form where rules can be deduced to detect motion of a subject. For example this embodiment may make it easier to specify a threshold value which more likely indicates the motion of the subject.

In another embodiment execution of the machine-executable instructions further cause the processor to detect motion of a subject at least partially by detecting the motion event in the motion signal by identifying portions of the motion signal above a predetermined value. In this embodiment a threshold value is used to indicate the motion event which indicates the motion of the subject.

In another embodiment execution of the machine-executable instructions further cause the processor to detect motion of the subject at least partially by detecting the motion event in the motion signal by first calculating a motion probability by comparing each value of the motion signal to a probability function and then identifying if the motion probability is above a predetermined probability. For example the motion signal for a particular time window can be fit to a chi-square distribution and the probability that points outside of the chi-square distribution may be calculated. If a particular motion signal has an extremely large probability of deviating from the chi-square distribution then this may be used to identify a motion event. The motion event in this case is a signal or group of signals which deviate from a likely probability distribution and indicate the likely motion of the subject.

In another embodiment the instrument is a magnetic resonance imaging system. The radio-frequency antenna is a magnetic resonance imaging antenna for acquiring magnetic resonance data. The radio-frequency signal from each of the multiple antenna elements is magnetic resonance data. Execution of the machine-executable instructions further cause the processor to acquire magnetic resonance data by controlling the magnetic resonance imaging system with the pulse sequence commands. The step of controlling the radio-frequency system to receive the radio-frequency signal from each of the multiple antenna elements may be considered to be a sub-step for part of controlling the magnetic resonance imaging system to acquire the magnetic resonance data.

For example the magnetic resonance imaging technique used may be a parallel imaging technique where data is acquired simultaneously from the multiple antenna elements. The technique of detecting motion of the subject may be used using the acquired magnetic resonance data. This may have the advantage of providing accurate detection of motion of the subject without adding any time to a magnetic resonance imaging protocol.

Another factor which may make this as an attractive method of detecting motion of a subject during a magnetic resonance imaging scan is that magnetic resonance imaging systems are typically placed inside of radio-frequency shielded rooms. This reduces the likelihood that stray radio-frequency transmissions or noise would affect the detection of motion of the subject.

In another embodiment execution of the machine-executable instructions cause the processor to extract the noise signal for each of the radio-frequency signals from each of the multiple antenna elements by applying a digital high-pass filter to the magnetic resonance data for each of the multiple antenna elements. The use of a high-pass filter to separate the noise may work particularly well because the higher frequencies are related to smaller or local areas in real space. This may be used for example to separate portions of the magnetic resonance data which are purely noise from those which contain image information. This may be useful in generating a noise signal which may be used to more accurately detect the motion of a subject.

In another embodiment execution of the machine-executable instructions cause the processor to extract the noise signal from the radio-frequency signal from each of the multiple elements by first calculating a Fourier transform of the magnetic resonance data. Third, by constructing a histogram of the Fourier transformed magnetic resonance data in the noise area and fourthly, by fitting the probability distribution to the histogram and finally generating the noise signal by calculating a fitting measure of the fit of the probability distribution to the histogram. For example if the probability distribution has a worse fit then this may indicate that portions of the data are due to MR signal and not to thermal noise. This analysis is done in so called hybrid space.

In a further extension of this embodiment it may be possible to iteratively resize the noise region in the hybrid space which may be called for example hybrid x-ky-(kz)-k-space line so that as many points as possible are taken into account for the histogram as long as the fitting measure still indicates a reliable fit.

In some cases the normed noise signal is calculated by using a real valued width parameter or fitting parameter of a probability distribution. Width parameter for example may be a fit or fitting parameter. In this case the noise signal is generated from the parameters of the fit. The fitting measure of the fit used to describe how well the probability distribution matches the noise histogram. In this way the fitting measure can also be used to iteratively improve the size of the noise region and thus improve the quality and reliability of the fit parameters.

In another embodiment each noise signal is real valued. The mathematical norm is any one of the following: an absolute value, a square of the noise signal, a root mean square of the noise signal over a predetermined duration or time, and a real valued width parameter of a probability distribution function describing the distribution of the noise signal. The width parameter may for instance be a fitting parameter or parameter which is varied to fit the probability distribution to the noise signal for a period of time.

It is possible that the data is likely in discreet values and is correlated in time. In general one could look at each discreet value to calculate the norm. One could also however average several points and then apply the mean to this averaged value. This could be done with a running average or within blocks or values of time for each of the noise signals. This may also apply when the noise signal is complex valued.

In another embodiment each of the noise signals is complex valued. The mathematical norm is any one of the following: the Euclidean norm, a vector length, a square of the vector length, a root mean square of the noise signal over a predetermined time, a root mean square of the vector length over the predetermined time, a width parameter or fitting parameter of a probability distribution function described in the distribution of the noise signal, and a width parameter to fit a histogram of the noise signal.

In another aspect, the invention provides for a method of operating an instrument. The instrument comprises a radio-frequency antenna comprising multiple antenna elements. The instrument further comprises a radio-frequency system comprising independent receive channels for receiving a radio-frequency signal from each of the multiple antenna elements. The method comprises the step of controlling the radio-frequency system to receive the radio-frequency signal from each of the multiple antenna elements. The method further comprises extracting a noise signal from the radio-frequency signals from each of the multiple antenna elements. The method further comprises calculating a norm signal for each noise signal by applying a mathematical norm to each noise signal. The method further comprises the step of calculating a covariance of the norm signal between each of the multiple antenna elements. The method further comprises calculating a motion signal by summing each covariance of the norm signal. The method further comprises detecting motion of the subject by detecting the motion event in the motion signal.

In another aspect the invention provides for a computer program product comprising instructions for a processor for controlling an instrument. The instrument comprises a radio-frequency antenna comprising multiple antenna elements. The instrument further comprises a radio-frequency system comprising independent receive channels for receiving a radio-frequency signal from each of the multiple antenna elements. Execution of the machine-executable instructions causes the processor to control the radio-frequency system to receive the radio-frequency signal from each of the multiple antenna elements. Execution of the machine-executable instructions further cause the processor to extract a noise signal from the radio-frequency signal from each of the multiple antenna elements. Execution of the machine-executable instructions further cause the processor to calculate a norm signal for each noise signal by applying the mathematical norm to each noise signal. Execution of the machine-executable instructions further cause the processor to calculate a covariance of the norm signal between each of the multiple antenna elements. Execution of the machine-executable instructions further cause the processor to calculate a motion signal by summing each covariance of the norm signal. Execution of the machine-executable instructions further cause the processor to detect motion of a subject by detecting a motion event in the motion signal.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
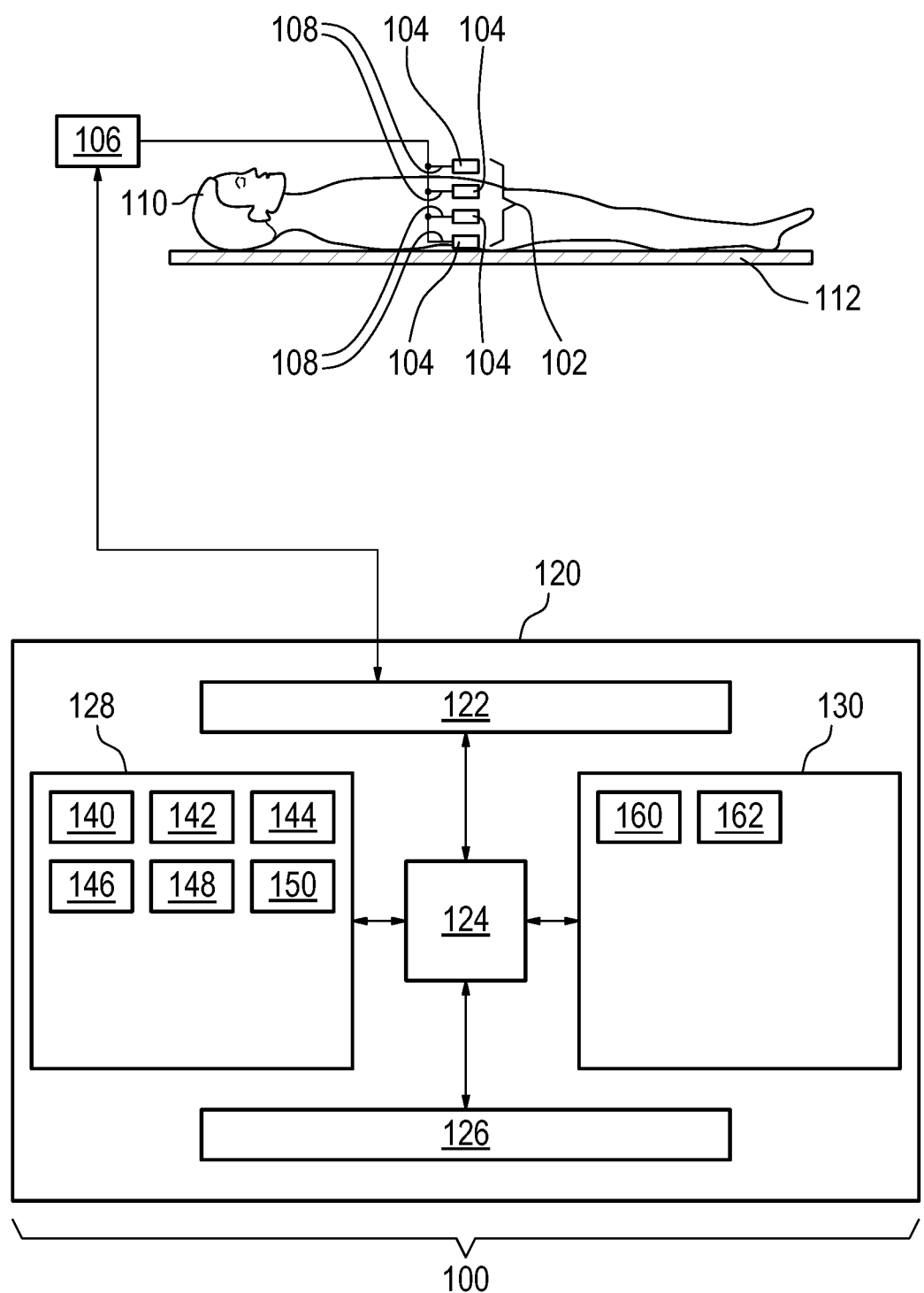
FIG. 1 illustrates an example of an instrument.

FIG. 1 illustrates an example of an instrument 100. The instrument is shown as comprising a radio-frequency antenna 102 that has multiple antenna elements 104. The radio-frequency antenna is connected to a radio-frequency system 106 that has independent receive channels 108 for each of the antenna elements 104. In the simplest example the radio-frequency system 106 is a receiver. In other instruments it is possible that the radio-frequency system 106 could also be a transceiver and in some instances radio-frequency signals may be transmitted to the antenna elements 104. For example, the radio-frequency antenna 102 could be a so called birdcage coil with multiple antenna elements 104 that is used for example for magnetic resonance imaging. Such a birdcage coil could be used for either transmitting and/or receiving radio-frequency signals during a magnetic resonance imaging protocol. In some examples the radio-frequency antenna 102 may have a structure that holds the antenna elements 104 in positions rigidly with respect to each other. A subject 110 is shown as reposing on a subject support 112. The multiple antenna elements surround the subject 110 and can be used to detect motion of the subject 110.

The radio-frequency system 106 is shown as being connected to a hardware system 122 of a computer 120. The computer 120 further comprises a processor 124. The processor 124 is connected to the hardware interface 122. The hardware interface 122 enables the processor 124 to send and receive data and commands to the instrument 100. The computer 120 further comprises a user interface 126, computer storage 128 and computer memory 130 that are in communication with the processor 124.

The contents of the computer storage 128 and the computer memory 130 may be interchangeable. In some examples the contents of the computer storage 128 may be duplicated in the computer memory 130.

The computer storage 128 is shown as containing radio-frequency signals 140 that were received from the radio-frequency system 106. The computer storage 128 is further shown as containing noise signals 142 that were extracted from the radio-frequency signals 140. The computer storage 128 is further shown as containing norm signals 144 that were calculated from the noise signals 142. The computer storage 128 is further shown as containing covariance 146 between the norm signals 144. The computer storage 128 is further shown as containing a motion signal 148 that is constructed by summing the covariances 146. The computer storage 128 is further shown as containing a detected motion event 150 that was obtained by analyzing the motion signal 148.

The computer storage 130 is further shown as containing a control module 160 that contains computer-executable code which enables the processor 124 to control the operation and function of the instrument 100 and also to perform various operations for obtaining the motion signal 148 and detecting the detected motion event 150. The computer storage 130 is further shown as containing a digital signal processing module 162 which enables the processor 124 to apply various digital signal processing techniques to the data 140, 142, 144, 146, 148, 150 that are stored in the computer storage 128. In different examples the digital signal processing module 162 may enable various types of filtering and in some cases may enable the application of Fourier transforms which may be used for transforming magnetic resonance data into images or performing other operations on magnetic resonance data or radio-frequency signals 140 in general.

Figure 2:
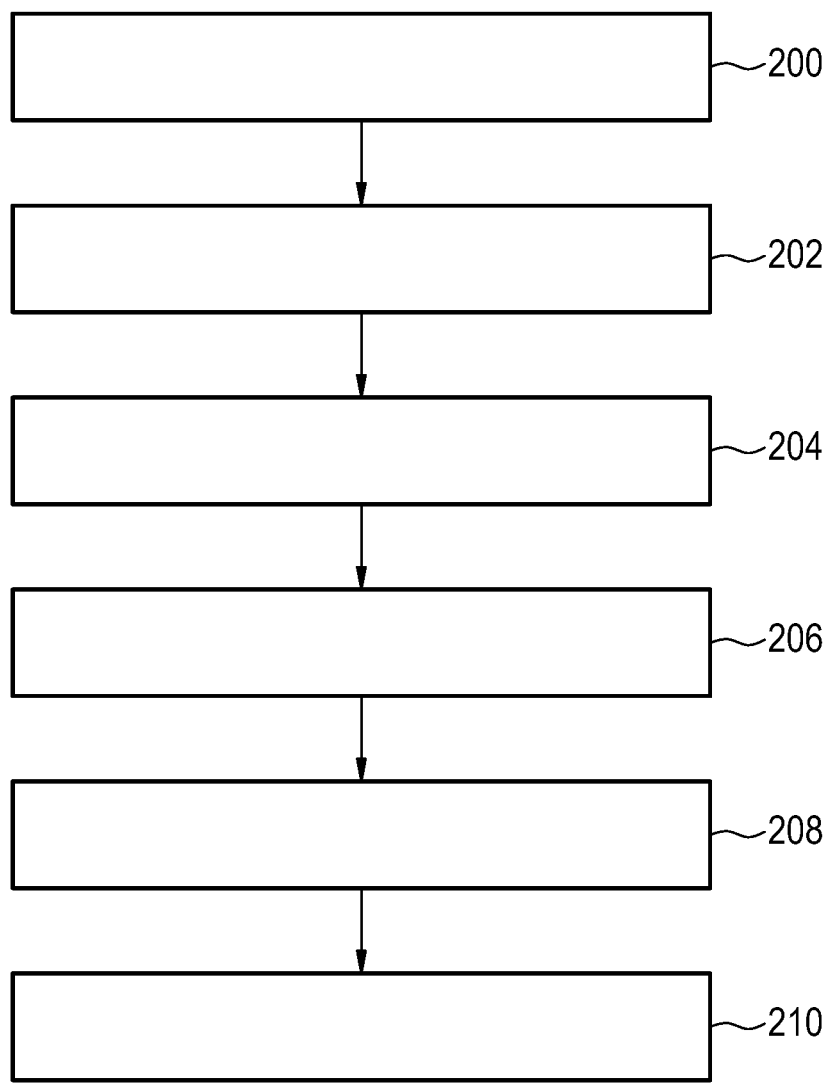
FIG. 2 shows a flow chart of a method of operating the instrument of FIG. 1.

FIG. 2 shows a flowchart which illustrates a method of operating the instrument 100 of FIG. 1. First in step 200 the radio-frequency system 106 is controlled to receive the radio-frequency signals 140 from each of the multiple antenna elements 104. Next in step 202 a noise signal 142 is extracted from the radio-frequency signal 140 from each of the multiple antenna elements 104. Next in step 204 a normed signal 144 is calculated for each noise signal 142 by applying a mathematical norm to each noise signal 142. Next in step 206 a covariance 146 between the normed signals 144 is calculated. In step 208 a motion signal 148 is calculated by summing each of the covariances 146 together. This creates a positive real valued function with a single value. Next in step 210 a motion event 150 is detected in the motion signal 148. A motion event is simply a time or a location in the motion signal that is identified as indicating that the subject 110 has moved relative to the antenna elements 104.

Figure 3:
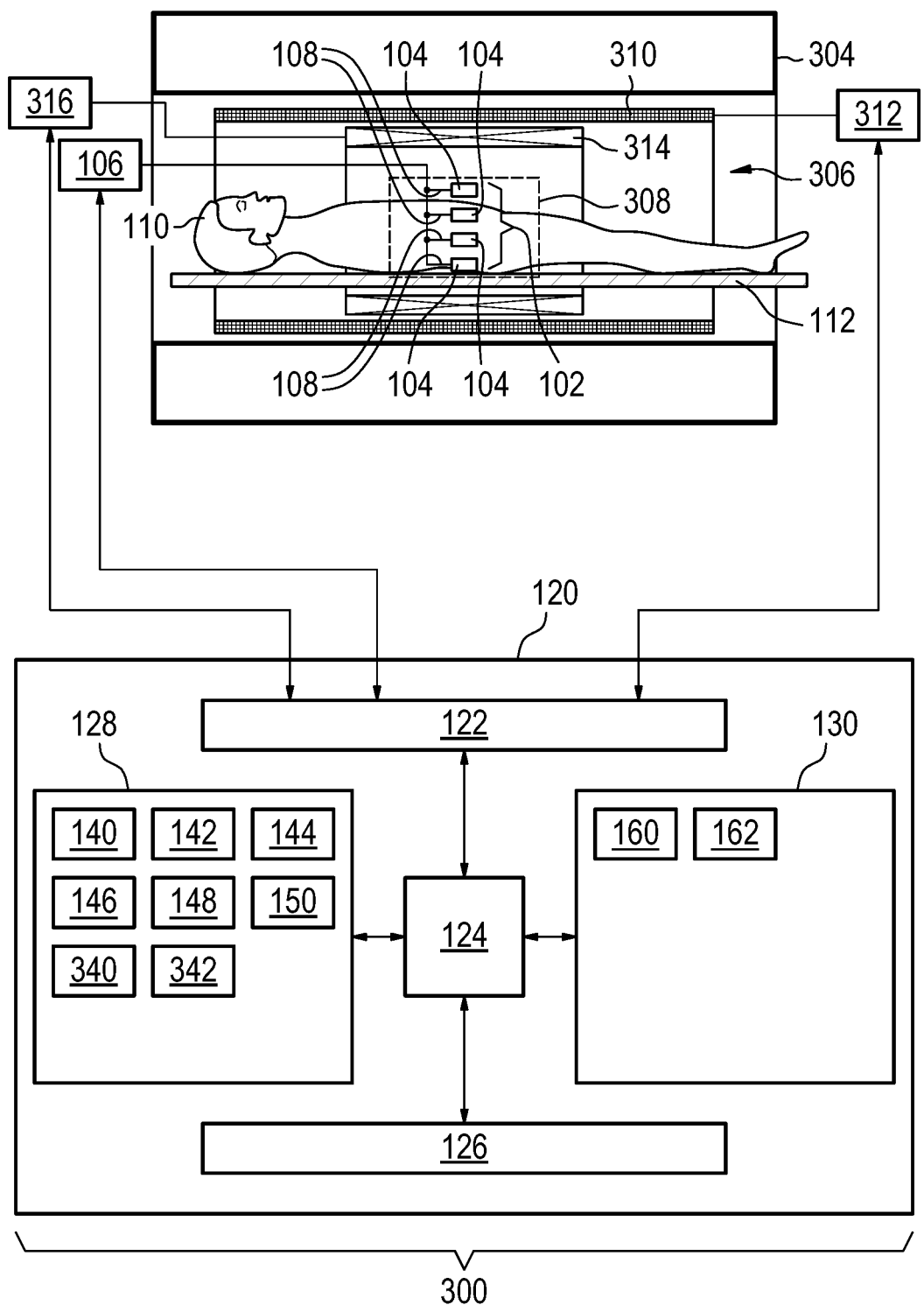
FIG. 3 shows a further example of an instrument.

FIG. 3 shows a further example of an instrument where the instrument is a magnetic resonance imaging system 300. In this case the computer 120 and process 124 control the function and operation of the magnetic resonance imaging system. The instrument 300 comprises the computer system 120 of the example shown in FIG. 1. In this instrument 300 the interface 122 is a hardware interface used for controlling a magnetic resonance imaging system.

The magnetic resonance imaging system comprises a magnet 304. The magnet 304 is a superconducting cylindrical type magnet 304 with a bore 306 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 308 where the magnetic field is strong and uniform enough to perform magnetic resonance imaging.

Within the bore 306 of the magnet there is also a set of magnetic field gradient coils 310 which is used for acquisition of magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Within the bore 306 of the magnet 304 is a body coil 314. The body coil 314 is shown as being connected to a transceiver 316. In some embodiments body coil 314 may also be connected to a whole body coil radio frequency amplifier and/or receiver, however this is not shown in this example. If both a transmitter and a receiver 316 are connected to the whole body coil 314, a means for switching between the transmit and receive mode may be provided. For example a circuit with a pin diode may be used to select the transmit or receive mode. A subject support 122 supports a subject 110 within the imaging zone.

A transceiver 106 is shown as being connected to a magnetic resonance imaging coil 102. In this example the magnetic resonance imaging coil 102 comprising multiple coil elements 104. The transceiver 106 is operable for sending and receiving individual RF signals to the individual coil elements 104. In this example the transceiver 106 and the transceiver 316 are shown as being separate units. However, in other examples the units 316 and 106 could be combined.

The transceiver 316, the transceiver 106, and the magnetic field gradient coil power supply are shown as being connected to a hardware interface 122 of the computer 120. In this example the radio-frequency signals 140 are magnetic resonance data. The antenna 102 is a magnetic resonance imaging antenna and the radio-frequency system 106 may for example by a receiver or a transceiver.

The computer storage 128 is further shown as containing pulse sequence commands 340. The pulse sequence commands are commands or data which may be used to acquire the magnetic resonance data 140 according to a magnetic resonance imaging protocol. For example the pulse sequence commands 340 may in particular be for performing a method of parallel imaging using the multiple antenna elements 104. Although not shown in this Fig. there may be additional data and software modules for performing the parallel imaging technique which for example are used to determine or have predetermined coil sensitivities for performing the parallel imaging technique. The computer storage 128 is further shown as containing a magnetic resonance image 342 that has been reconstructed from the magnetic resonance data 140. In this example the digital signal processing module 162 may contain instructions which enable the processor 124 to reconstruct the magnetic resonance image 342 from the magnetic resonance data 140.

A potential advantage of the system shown in FIG. 3 is that the normally acquired magnetic resonance data 140 may at the same time as it is being acquired be used to detect motion of the subject 110. This may be used in various ways to improve the quality of the magnetic resonance image 342. For example if it is known that the subject is moving 110 the acquisition of the magnetic resonance data 140 can be stopped and/or modified during the acquisition of the data 140.

The properties of RF coils can be used to reflect or determine patient motion in MRI. The noise level measured by the MR receive coil can be sufficient to deduce patient motion. This approach is very appealing, since it might be possible to gather information on motion already by the noise, which is contained in the MR images anyhow, i.e. not requiring additional changes on sequences or hardware.

Previously, not much effort has been spent on how the noise signals are exactly calculated as well as how motion is finally detected from these signals. The post-processing of the noise-levels is so far limited to moving average filtering.

Examples may define a motion signal, which is based on correlations in the measured RF noise-level/noise-power between different coil channels. These correlations bear additional information, which can be harvested to improve motion detection. Applying different weighting factors and evaluations based on the underlying statistics, the performance can be further improved. Thus motion detection is significantly facilitated. In this way gross motions, e.g. of the head, can be easily detected.

It is proposed to deduce a motion signal based on noise-level (or noise power) correlations between the different coil channels. In this way gross motions e.g. of the head can be easily detected.

In some examples RF noise may be sued to monitor patient motion (incl. respiration) is however not limited to MRI, but can in principle be applied outside the MRI system for monitoring purposes as well The main objective of a "noise navigator" or the noise signal described herein may be to detect patient motion (gross motion, respiration, . . . ) during MR imaging by sampling RF noise. This is possible since movements of conductive material (e.g. tissues) in the sensitive region of RF receive coils lead to changes in the received RF noise. However, these changes are relatively minor, thus efficient post processing methods may be beneficial for improving the reliability of motion detection based on the measured RF noise.

In some examples a motion signal is defined which is based on correlations in the measured RF noise-level/noise-power between different coil channels. These correlations bear additional information, which can be harvested to improve motion detection. Applying different weighting factors and evaluations based on the underlying statistics, the performance can be further improved. Thus motion detection is significantly facilitated.

Figure 4:
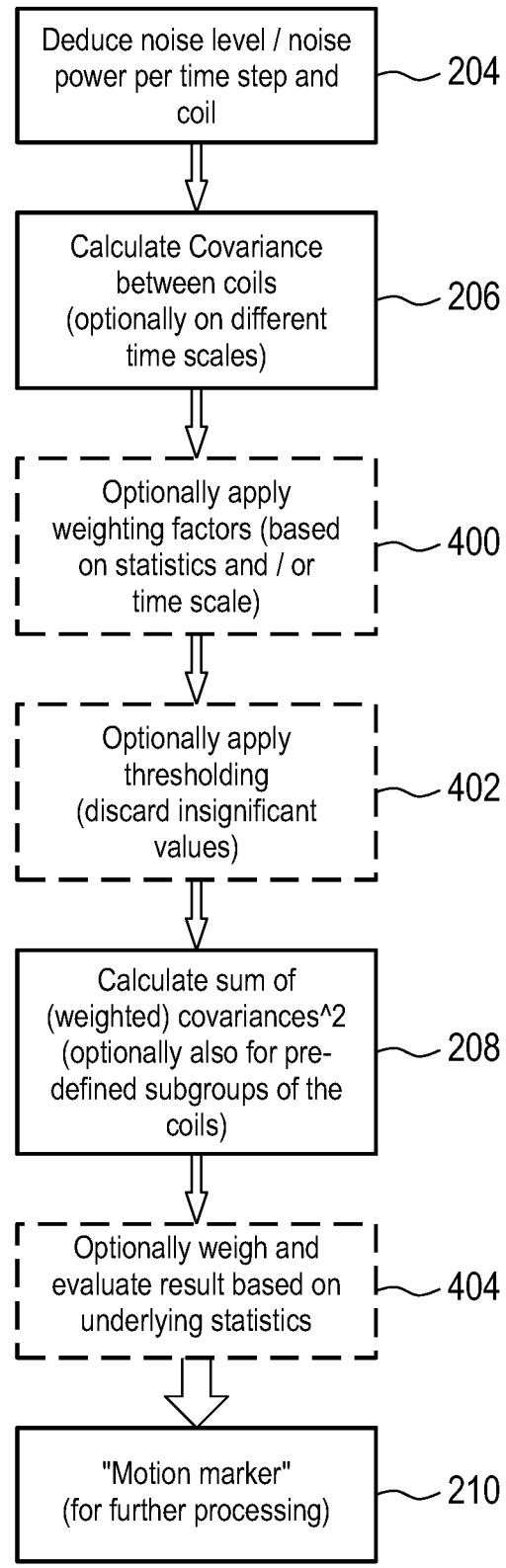
FIG. 4 shows a flow chart which illustrates a method.

FIG. 4 shows a flowchart which illustrates additional method steps which may be performed in the method of FIG. 2. Not all of the steps of FIG. 2 are shown here. The first step is equivalent to step 204. In this step the noise level or the noise power per time step and per coil is deduced. Next in step 206, which is equivalent to step 206 in FIG. 2, the covariance between the noise of each coil is calculated. This may optionally be done on different timescales. Step 400 is an optional step where weighting factors are applied based on statistic and/or a particular timescale. Step 402 is another optional step where thresholding is applied. This may result in insignificant values of the norm signal or the covariance in being discarded. The next step is equivalent to step 208. In this step the weighted sum of covariances and also optionally for predetermined sub-groups of the antenna elements 104 are calculated. The next step, step number 404, is optional and is to weigh and evaluate the results based on underlying statistics. The final step is equivalent to step 210 and in this step the motion event is detected and used for further processing.

Figure 5:
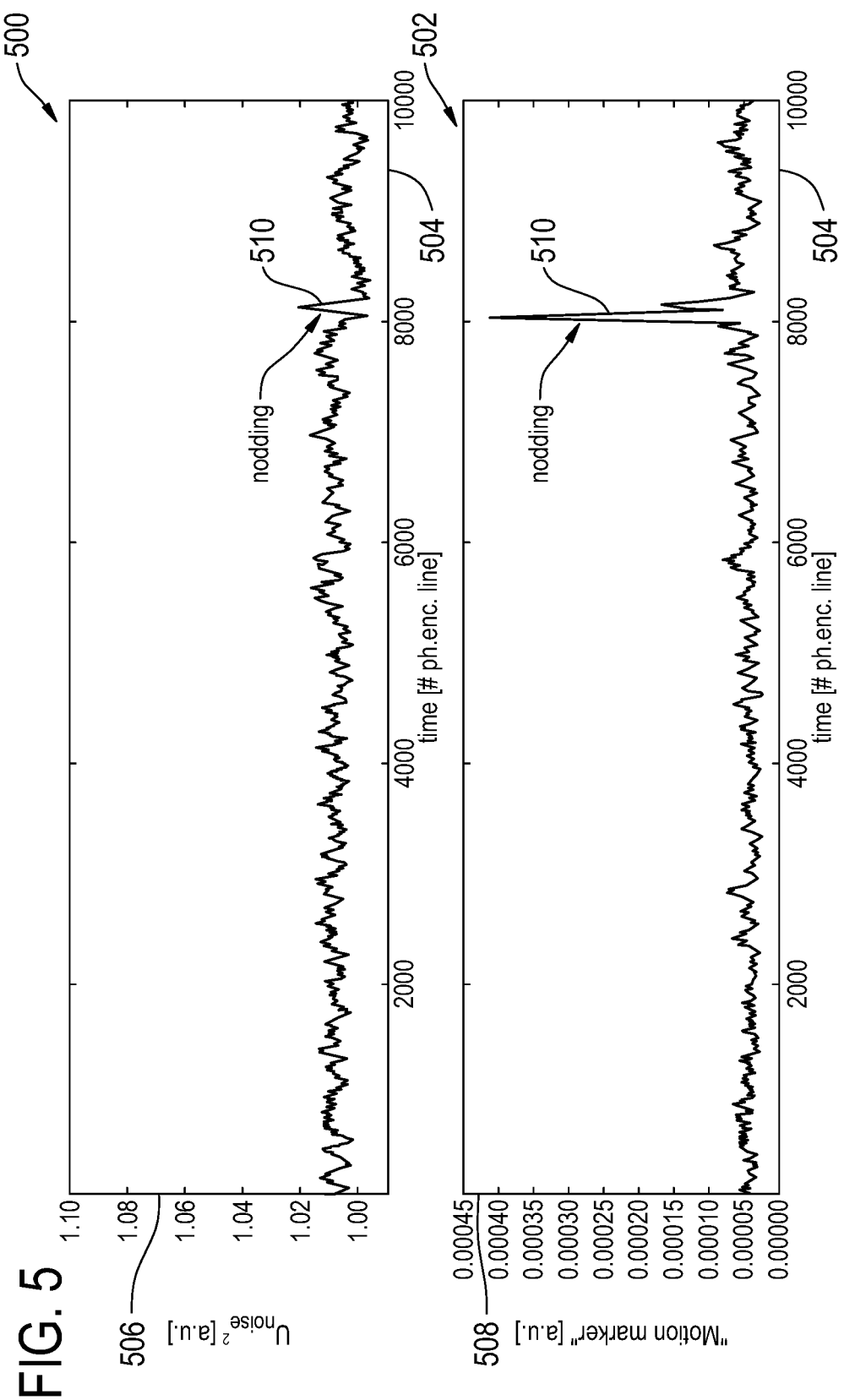
FIG. 5 shows a noise signal and a motion signal.

FIG. 5 shows a plot of a noise power versus time 500 and a plot of a noise signal 502 versus time. In both plots the x-axis labeled 504 is given in time steps. The x-axis on plot 500 is the square of the noise power with all channels added. This is essentially the sum of noise on all channels of the antenna elements. The y-axis on plot 502 shows a noise signal 508 calculated as described herein. In both plots a motion event 510 is shown. In this case a head coil was used and a nodding motion 510 was performed by a subject. In plot 500 the noise power, the effect on the summed noise power is that there is a large increase. However, it is very difficult to distinguish the nodding motion 510 from the background thermal noise. Plot 502 shows how the calculation of the noise signal 508 may result in easier detection of the motion 510. In this case the nodding motion 510 is clearly much larger and more identifiable than the thermal noise. FIG. 5 is an example of pure noise signals (noise power, sum of all available channels, top row) and the proposed motion signal employing correlations (bottom row). The nodding which took place during the measurement can be significantly better identified in the motion signal. All averaging parameters are set to equal values (75 lines/measurements).

An overview of the proposed approach is given in FIG. 4 and is detailed below. Some or all of the steps below may be optional.

The basic procedure is as follows:

The mean noise levels/the mean noise power, i.e. $|U_{noise}|$ or $U_{noise}^2$ are deduced, e.g. by applying fits, filtering or simple squaring and averaging. It is important to stress, that the noise power (or something equivalent) has to be used for this proposed method and not the original noise signals and as routinely done for parallel imaging reconstructions. Noise correlations are given by shared noise sources, whereas correlations in the noise power only require correlated movement of different noise sources. Thus the latter is significantly better suited for the detection of motion. E.g. noise sources at the front and the back of the head perform correlated movements (the head is more or less rigid), however they will hardly cause "real" noise correlations.

The covariance is calculated for the noise levels between different channels: $cov(x, y) = \overline{(x-\bar{x})*(y-\bar{y})}$, x,y denote the noise powers/levels of different channels. The bar denotes temporal averaging—the timescale of this averaging can be varied (for all the averaged values independently), leading to different "sensitivity windows". Optionally the noise levels might be normalized to their mean value.

Optionally, additional weighting factors might be applied (potentially already while calculating the covariance). These can e.g. be standard deviations of the signal (i.e. transforming the covariance to a correlation coefficient), probability density functions for x,y, probabilities of measuring a certain standard deviation for x,y within a certain time window, etc. Most of these probabilities can be easily deduced by applying basic rules of statistics. One objective is e.g. to put emphasis on events, which are less probably a pure stochastic fluctuation in the signal. Due to the stochastic nature of the signals, fluctuations are expected to occur, however those being very unlikely are apparently caused by an underlying motion (i.e. not of purely stochastic nature). The basic facts required for determining the corresponding probabilities are known (e.g. number of samples averaged, . . . ).

Optionally, a thresholding may be performed. The reasoning is similar to the optional weighting. Since minor correlations between the channels are to be expected purely due to stochastic fluctuations, values below a defined threshold can be discarded. The threshold can also be deduced by basic statistical assumptions.

The "motion signal" or "motion marker" is determined by summing up all squared covariance/correlation coefficients (except for "self"-correlations). Many types of motion can be significantly better recognized by temporal variations of this "motion signal" than by the original noise signals. An example is shown in FIG. 5. Here the noise signals of 13 head coil channels (sum) as well as the corresponding "motion signal" are depicted. During the measurement a nodding took place, which can be significantly better identified in the "motion signal" signal.

The "motion signal" can also be defined for certain subgroups of the coils (e.g. posterior, anterior, left, right, . . . ), meaning that the sum is confined only to those subgroups. This can be advantages for rather localized motions.

The "motion signal" can optionally be evaluated (and weighted) by a corresponding distribution function. Assuming e.g. that "purely stochastic" correlation coefficients obey a Gaussian distribution with mean 0, the "motion signal" will obey a chi2-distribution. Thus it can be deduced, how probable a certain value is assuming purely stochastic processes. A high prevalence of "unlikely" values strongly indicates motion. If the corresponding distribution functions are not known, they can be empirically determined by computer simulations (assuming defined conditions).

In using RF antennas to detect patient motion in MRI so far not much effort has been spent on how the noise signals are exactly measured and calculated: $<V_{noise}^2>$ is simply calculated from pure noise signals or "noise regions" in the images. In order to get sufficient statistical significance for the expected variations caused by motion (a few percent) additional averaging is performed on a timescale in the order of seconds. A major concern in calculating noise levels in general is to distinguish noise signals from "other" contributions like spurious MR signals or additional perturbations.

In contrast to a different, rather exhaustive proposition to solve this problem, a more pragmatic and computationally less complex method may be performed:

For example, it is possible to replace the Fourier transformation in frequency encoding direction by a sharp digital high pass filter, which can be easily realized (e.g. as iir-filter) and which does not require many resources. Subsequently for certain ensembles (e.g. for each phase encoding line) the mean squared signal and the mean signal^4 are computed, which is also computationally straightforward, and which can be used to calculate the excess kurtosis. Based on the excess kurtosis it can then be estimated, if the signal is purely noise or if other contributions are present. A more detailed description of the procedure is described below.

The low complexity of this approach might potentially even enable real-time performance.

The basic idea of using RF noise to monitor patient motion (incl. respiration) is not limited to MRI, but can in principle be applied outside the MRI system for monitoring purposes as well. In that case it is important to separate the patient noise from spurious RF emissions of other equipment (EM interference).

A major concern in calculating noise levels is to distinguish noise signals from "other" contributions like the MR signal or additional perturbations.

Albeit it is relatively straightforward to define which parts of the measured signals are expected to contain only noise based on the outline of the measured object, this approach turns out to be insufficient, since spurious signals tend to appear, which renders the motion detection by noise unreliable. An example of such a spurious signal is given in FIG. 6.

Figure 6:
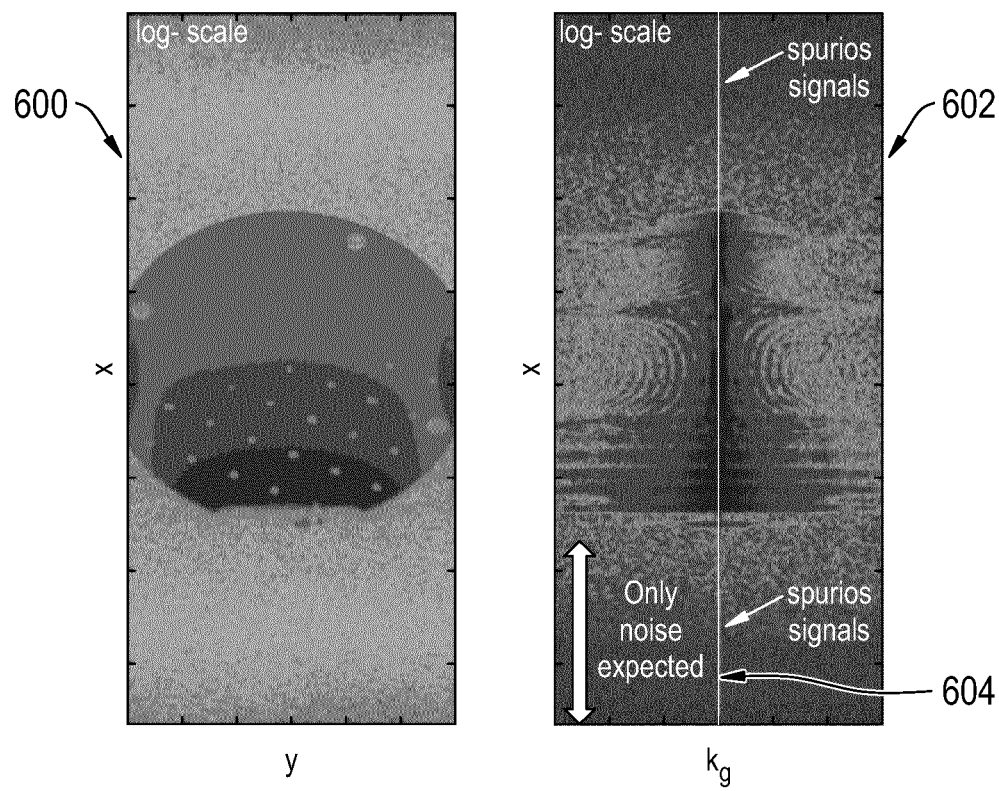
FIG. 6 shows a magnetic resonance image of a phantom in image space and in hybrid space.

FIG. 6 shows two images. Image 600 is an image of a phantom in image space. Image 602 shows a corresponding hybrid image that is partially in k-space and partially in image space. Image space is f-encoding in the x or horizontal direction and k-space in the y-direction. Image 602 further shows a spurious signal 604 that indicates signal leakage into the outer regions at ky approximately equal to zero.

Figure 7:
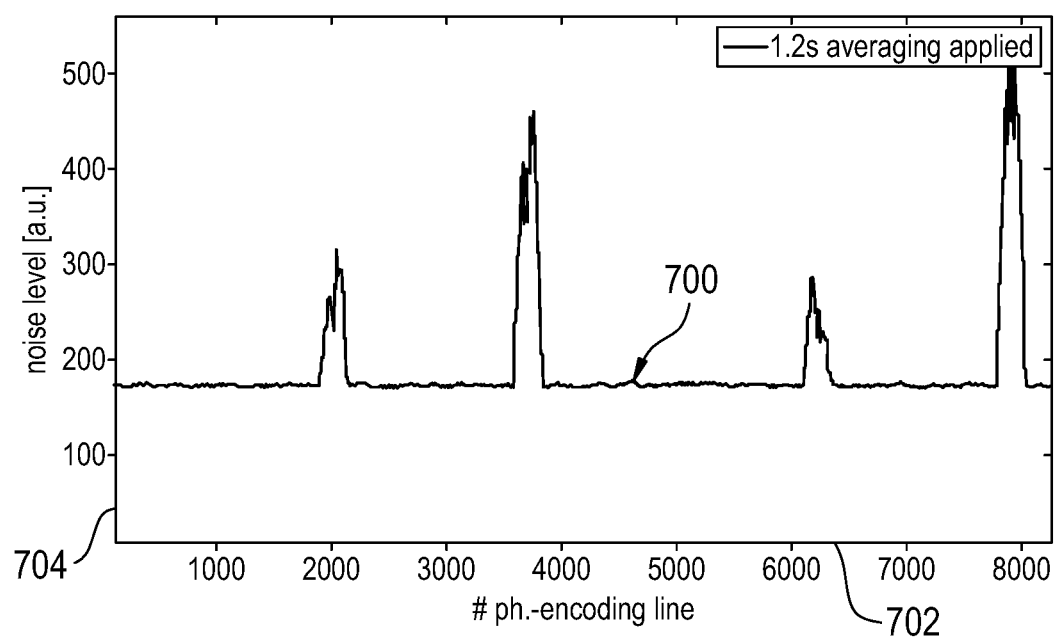
FIG. 7 shows noise variations with spurious signals.

Thus, FIG. 6 shows an example of spurious signals in the "noise region". Phantom image (left) and corresponding hybrid image (right; image space in f-encoding direction x, k-space in y), showing clearly signal leakage into outer regions at ky≈0. A logarithmic scale is chosen for clarity. The corresponding averaged noise level as a function of time is shown in FIG. 7. Although this is a rather extreme example, it shows nicely the potential misinterpretation: The noise signal variation looks similar to strong sudden head movements, albeit this is not possible, since the phantom hasn't moved.

FIG. 7 shows a plot 700 of the noise level 704 as a function of the phase encoding line 702 for the image 602. There are a number of large spikes in the plot 700. These could be similar to those of sudden strong head movements. However, this is not the case because this plot is for the stationary phantom shown in FIGS. 600 and 602. This is an example of the effective MR signal leakage on the noise level 704.

Figure 8:
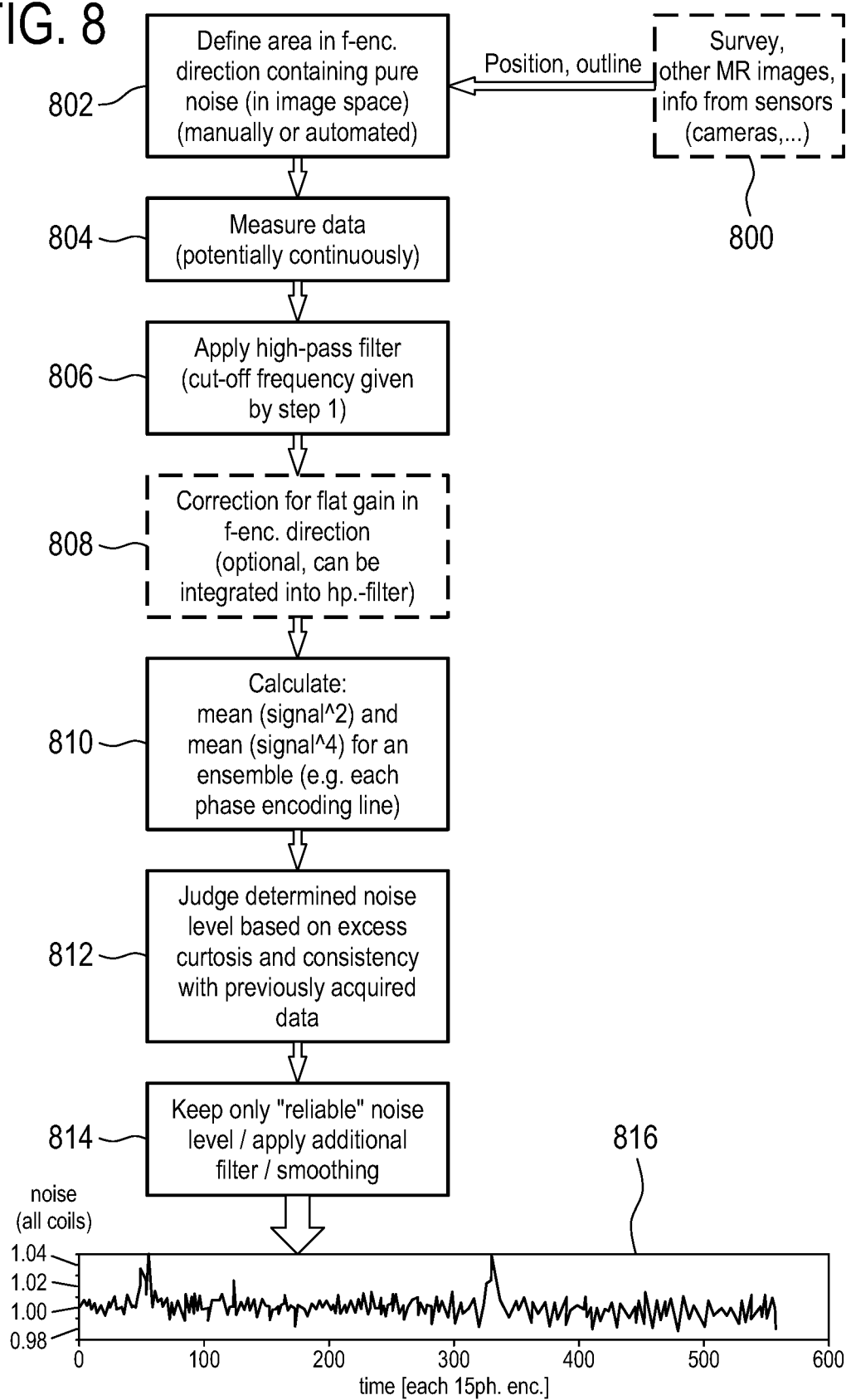
FIG. 8 shows a flow chart which illustrates a further method.

FIG. 8 shows a flowchart which illustrates a method of extracting a motion signal from a noise signal from radio-frequency signals 142 acquired on multiple antenna elements 104. These for example may be normal antenna elements 104 of a radio-frequency antenna or they may also be applicable to multiple antenna elements used in magnetic resonance imaging. First in step 800 radio-frequency data or magnetic resonance data is acquired 800. Next in step 802 an area is defined in a frequency encoding direction containing pure noise, for example in image space. This may be done manually or automated. Next in step 804 the radio-frequency data is acquired. This for instance may be done continuously or for intermittent periods of time. Next in step 806 a high pass filter is applied with a cut-off frequency defined by step 802. Step 808 is an optional step where a correction for a flat gain in the frequency encoding direction is performed. This for instance may also be incorporated into the high pass filter. Next in step 810 a mean or normed noise value is calculated for each phase encoding line. Next in step 812 the noise value is evaluated based on the level of excess kurtosis and consistency with previously acquired data. Finally in step 814 only reliable noise is kept or applied for additional filtering and/or smoothing. In step 816 a noise signal is output.

An overview of the proposed approach given in FIG. 8 is outlined below. Some of the steps are optional. The basic process is as follows:

The points in frequency encoding direction, which should purely contain noise (at the edges of the FOV (in image space), outside the object to be imaged) are determined. This can either be done manually or automatically based on the survey, other already recorded MR images or other sensors (e.g. cameras), which determine the outline of the object/patient.

The data is (continuously) measured 804 as lines in k-space.

The k-space lines are filtered by a high-pass filter. The cut-off frequency is given by the areas at the edge of the FOV defined in the first step. Since these edges correspond to high-frequency components in the raw-data in frequency encoding direction, a sharp high pass filter is able to separate them from the MR signal being constraint to lower frequencies. The filter can be easily realized digitally as an IIR or FIR filter. An example of the frequency response of a suitable IIR filter (16 coefficients) is shown in FIG. 9.

Figure 9:
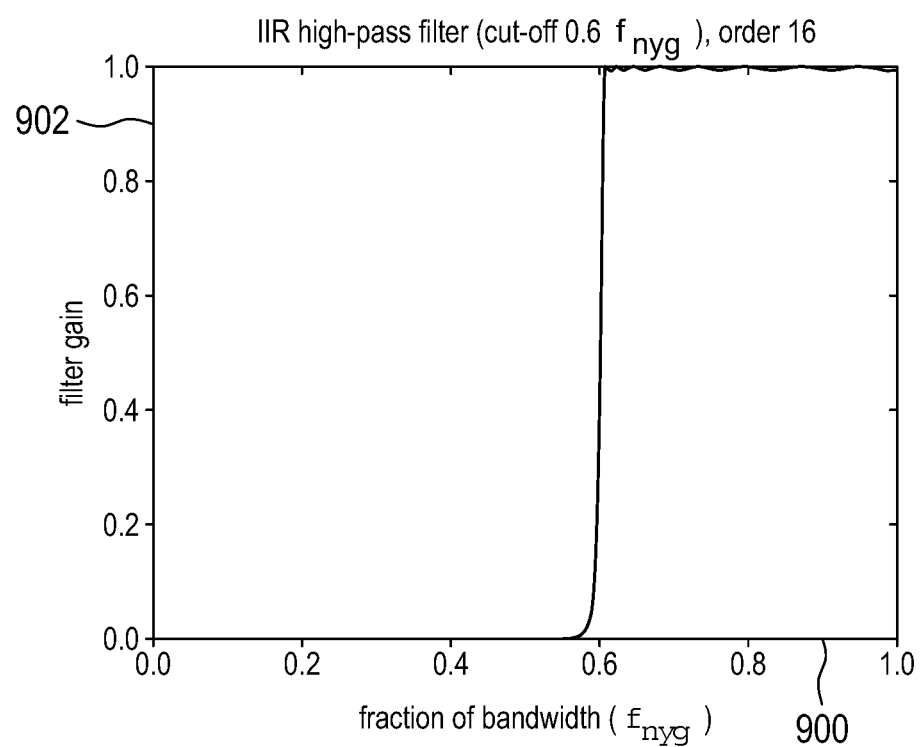
FIG. 9 shows a filter gain chart for a high pass filter.

FIG. 9 plots a filter gain 902 versus the fraction of bandwidth 900. This is done to show the frequency response of a high pass digital IIR filter with an order of 16. Sufficient attenuation and satisfactorily sharp transition can be achieved to separate the high-frequency noise from the lower frequency magnetic resonance signals.

An optional gain correction is performed in order to have a flat frequency response, i.e. that the noise level is independent of frequency. This eases the analysis and allows for an easier interpretation of the deduced statistical parameter (kurtosis). The correction can also be performed by means of a digital filter having an appropriate frequency response. This filter can in principle also be combined with the previous high-pass filter.

An ensemble of the filtered data (e.g. per each phase encoding line) is evaluated by calculating the mean signal^2 as well as the mean signal^4. This can either be done for real and imaginary parts separately or for the absolute value.

The excess kurtosis is calculated for these ensembles: excess kurtosis=E(signal^4)/E(signal^2)^2−3

Figure 10:
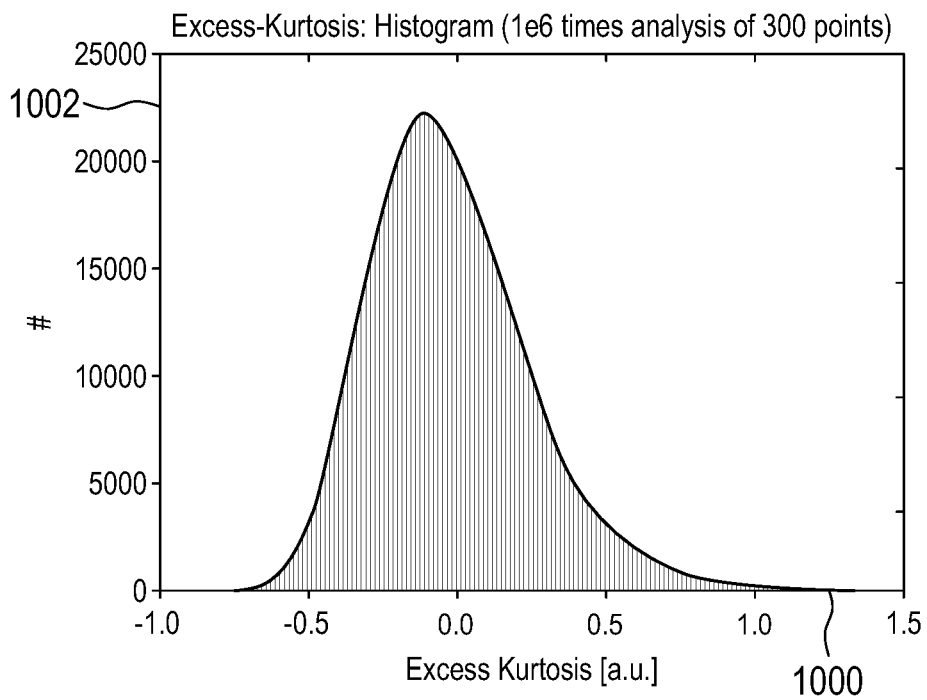
FIG. 10 shows an Excess Kurtosis Histogram.

The excess kurtosis describes the differences of the shape of a probability distribution to the normal distribution. I.e. for pure noise obeying Gaussian statistics on average 0 is expected. High and low values of the excess kurtosis are thus very unlikely. This is illustrated in FIG. 10 for an ensemble of 300 points, where excess kurtosis values <−0.5 or >0.65 have a probability below 2%. FIG. 10 shows a histogram with the excess kurtosis on the x-axis 1000 and the y-axis 1002 is the number of data sets with a particular excess kurtosis. The histogram in FIG. 10 was calculated for 1 million sets containing 300 points of Gaussian noise.

Thus very high and low excess kurtosis values are an indication of additional spurious signals and these noise signals should be correspondingly discarded.

The precise limits of the excess kurtosis for acceptance depend on sample size, required accuracy and the initial gain profile.

Figure 11:
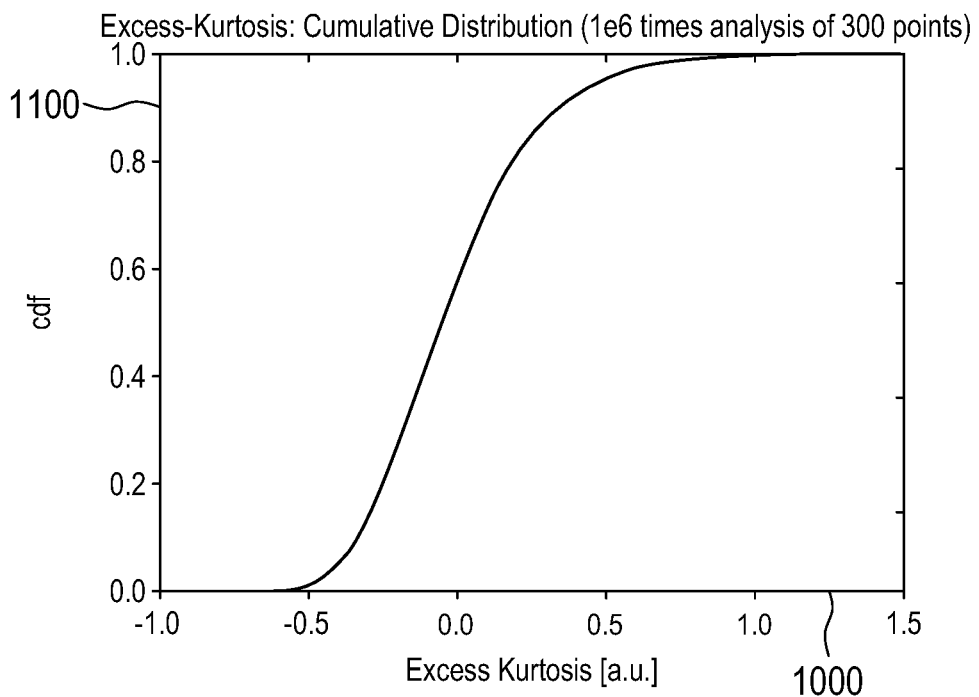
FIG. 11 shows a Cumulative distribution for the histogram of FIG. 10.

FIG. 11 shows a cumulative probability 1100 of a particular excess kurtosis 1000 for the plot shown in FIG. 10. The plot shown in FIG. 11 can be used to choose a particular excess kurtosis that has a cut off that has a low probability. It can be seen, that excess kurtosis values below −0.5 and above 0.65 are not very probable (<2%).

Additional information can be gathered from the difference of the deduced noise level from the previous average values. Since only modest variations are to be expected, it can be calculated how probable certain deviations of the currently analysed subset are. Too improbable values can be discarded, since they are obviously spoiled by other signals.

Finally the temporal variation of the deduced "reliable" noise levels can be further processed (filtering, . . . ).

Another, different method for data (noise) selection and processing is proposed, which utilizes (iterative) fitting of histograms with appropriate distribution functions. In this way mean noise levels can be deduced as well as additional information, which helps to judge, if the underlying data contains pure noise or additional spurious signals. Altogether it becomes possible to concentrate on "reliable" noise data and to sort out corrupted data.

A more detailed description of the procedure is given in the following section.

Figure 12:
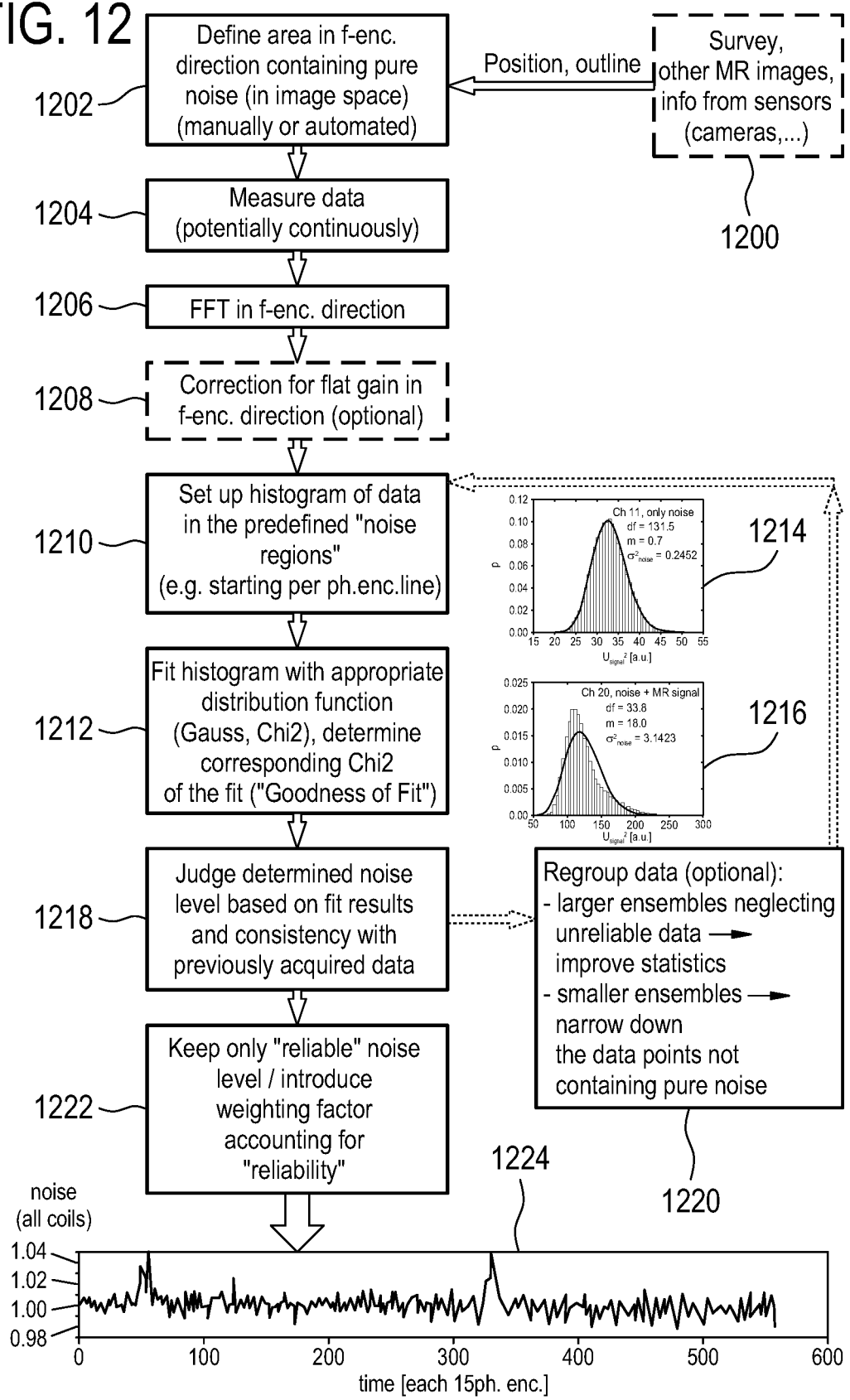
FIG. 12 shows a flow chart which illustrates a further method.
Figure 13:
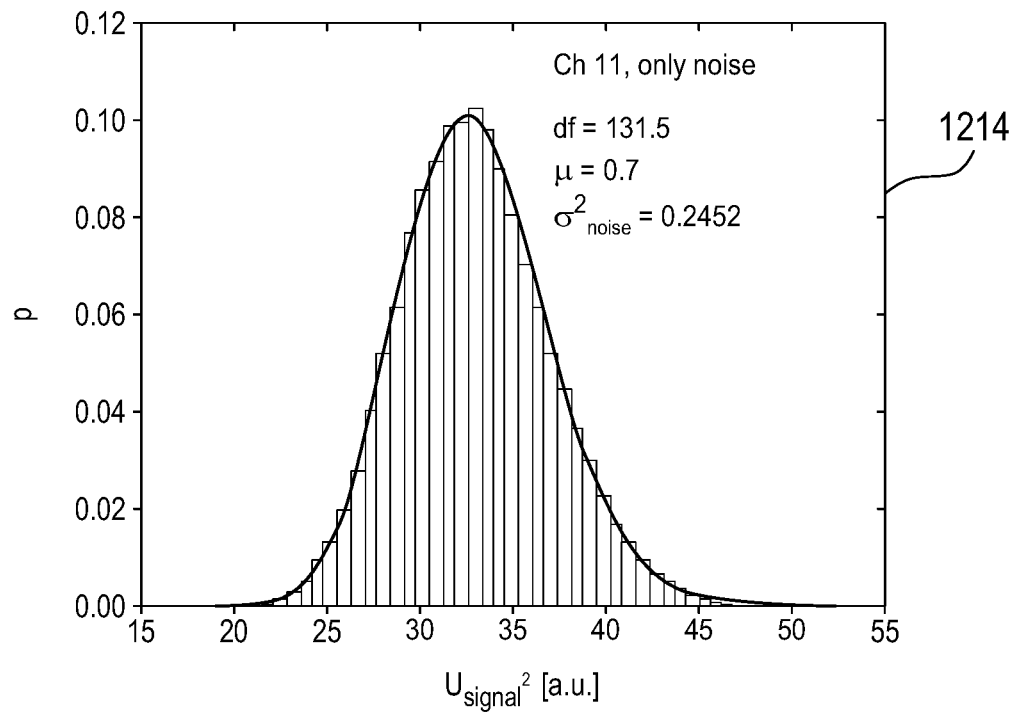
FIG. 13 shows a histogram of a pure noise signal.
Figure 14:
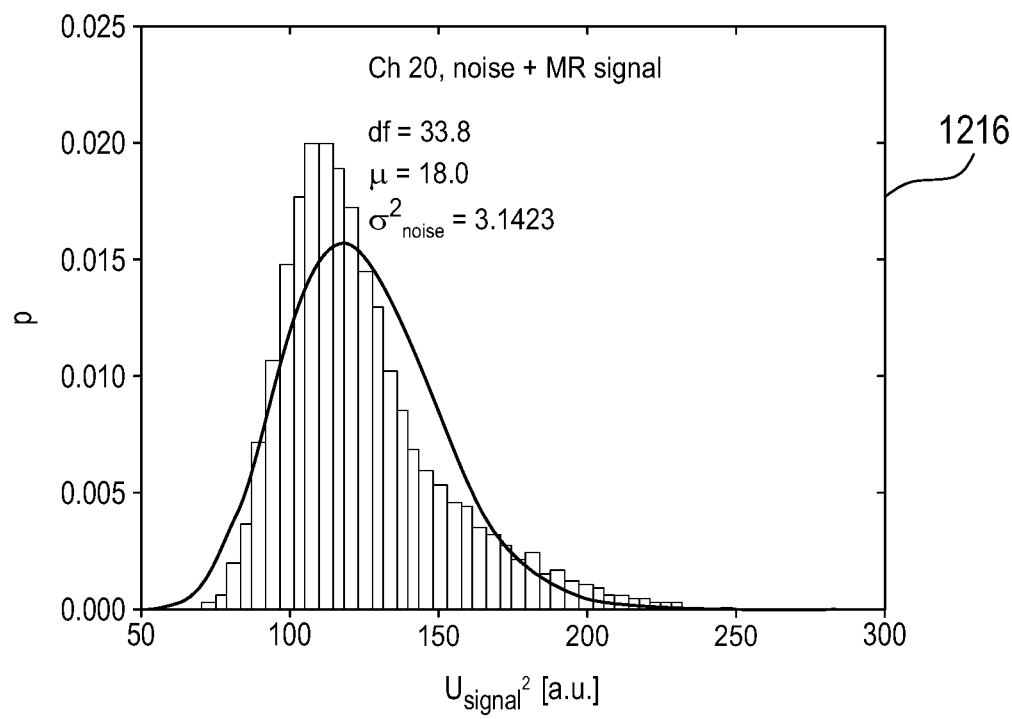
FIG. 14 shows a histogram of a noise mixed with a magnetic resonance signal.

FIG. 12 shows a flowchart that illustrates a method of reliable noise extraction from a radio-frequency signal. First in step 1200 optionally a survey or other MR image is used as a reference. Next in step 1202 an area in a frequency encoding direction containing pure noise is selected. Next in step 1204 radio-frequency data or magnetic resonance data is measured. In step 1206 a fast Fourier transform is applied in a frequency encoding direction. Optionally in step 1208, correction for a flat gain in the frequency encoding direction is applied. In step 1210 a histogram of data is set up in the predefined noise region. In step 1212 a histogram is fit with an appropriate distribution function (e.g. chi-square or Gaussian). Correspondingly, the goodness of the fit is determined, e.g. via its chi-square. Two different histograms are shown in FIGS. 1214 and 1216. These are enlarged in FIGS. 13 and 14. FIG. 1214 shows a histogram which contains only noise. It is considered to be good fit. FIG. 1216 shows noise plus a magnetic resonance signal. That is to say the histogram shown in FIG. 14 shows pure noise mixed with an MR signal which is not noise. It can be seen that the goodness of the fit is significantly worse. In step 1218 the determined noise level can be judged based on the fit results and consistency with previously acquired data. Optionally in step 1220 the data can be re-analyzed and samples which neglecting unreliable data can be improved or smaller samples can be selected which narrow down the data to points not containing the pure noise. For example in FIG. 1216 in FIG. 14 there is noise plus a magnetic resonance signal. The region from which the noise is obtained can be modified so that the amount of MR signal is reduced. If optional step 1220 is performed then the method then proceeds back to step 1210 and this is repeated. After step 1218 is performed noise or data which is not reliably noise is discarded. This is then used to provide the final noise signal 1224.

An overview of the proposed approach is given in FIG. 12. Some of the steps are optional. The basic process is as follows:

The points in frequency encoding direction, which should purely contain noise (at the edges of the FOV (in image space), outside the object to be imaged) are determined. This can either be done manually or automatically based on the survey, other already recorded MR images or other sensors (e.g. cameras), which determine the outline of the object/patient.

The data is (continuously) measured as lines in k-space.

The k-space lines are Fourier transformed in f-enc. direction

An optional gain correction is performed in order to have a flat frequency response, i.e. that the noise level is independent of frequency. This eases the analysis and allows for a better interpretation of the deduced statistical parameters.

A histogram is set up for the signals at the positions determined in the first step. This can either be done for real and imaginary parts independently or combined. Another possible choice for the histogram is "sum of squares" either for each point individually or for equally sized sub-ensembles.

A fit of the corresponding probability distribution function (pdf) to the histogram is performed. The pdf is either a Gaussian function or a Chi2-distribution. The latter is used if sum of squares were used. The fit provides information on mean values (should be 0 for noise), the width of the distribution (the noise level) and in case of the chi2 distribution the degrees of freedom, which should equal the number of independent values used to compute the sum of squares.

Additionally, a chi2 for the histogram-fit is to be computed, which describes how well the pdf could be fit to the data.

Based on the fit results, it can be estimated, if the data is purely noise or contains spurious MR signals. An example is given in FIG. 15. Here several channels contain additional MR signals, which leads to a high chi2 for the fits (a chi2-pdf in this case) and also to significantly different degrees of freedom (df)

Additional information can be gathered from the difference of the deduced noise level from the previous average values. Since only modest variations are to be expected, it can be calculated how probable certain deviations of the currently analysed subset are. Too improbable values can be discarded, since they are obviously spoiled by other signals.

Optionally, the fitting procedure can be repeated with different ensemble sizes.

- It might be valuable to increase the sample size by evaluating several phase encoding lines at the same time (neglecting those already identified to contain spurious signals). This is useful if the data is measured nearly at the same time (compared to the timescale of expected patient motion) since it leads to more accurate results.
- The sample size might be reduced in order to narrow down spurious signals. Maybe not the whole ensemble is spoiled, so some "noise information" still might be gathered.

Finally the temporal variation of the deduced "reliable" noise levels can be further processed (filtering, . . . ).

Figure 15:
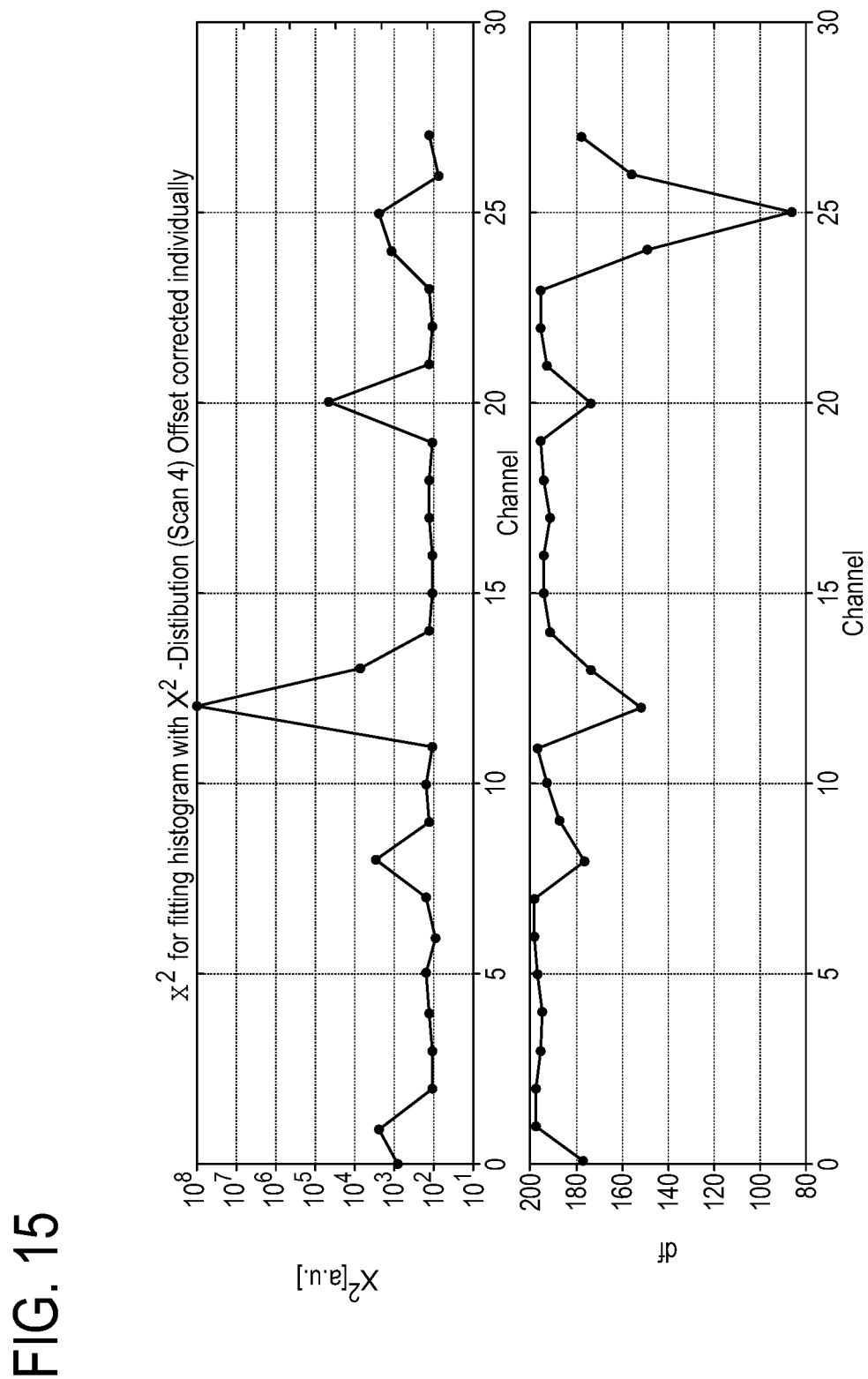
FIG. 15 shows a Chi2 and a degree of freedom for a fit of noise histograms.

FIG. 15 shows the Variation of chi2 and the degrees of freedom (df) for a fit of noise histograms with a chi2-distribution. Some channels are spoiled by MR signals, which is clearly observable by the deviations from the expected values (100, 200).

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 instrument
102 radio-frequency antenna
104 antenna elements
106 radio-frequency system
108 receive channel
110 subject
112 support
120 computer
122 hardware interface
124 processor
126 user interface
128 computer storage
130 computer memory
140 radio-frequency signals
142 noise signals
144 normed signals
146 covariance between normed signals
148 motion signal
150 detected motion event
160 control module
162 digital signal processing module
200 control the radio-frequency system to receive the radio frequency signal from each of the multiple antenna elements
202 extract a noise signal from the radio frequency signal from each of the multiple antenna elements
204 calculate a normed signal for each noise signal by applying a mathematical norm to each noise signal
206 calculate a covariance of the normed signal between each of the multiple antenna elements
208 calculate a motion signal by summing each covariance of the normed signal
210 detect motion of a subject by detecting a motion event in the motion signal
300 medical apparatus
302 magnetic resonance imaging system
304 magnet
306 bore of magnet
308 imaging zone
310 magnetic field gradient coils
312 magnetic field gradient coil power supply
314 body coil
316 transceiver
340 pulse sequence commands
342 magnetic resonance image
500 noise power vs. time
502 noise signal vs. time
504 time step
506 power
508 noise signal
510 motion event
600 image of phantom in image space
602 image of phantom in hybrid space
604 spurious signal
700 plot
702 phase encoding line
704 noise level
900 fraction of bandwidth
902 filter gain
1000 excess kurtosis
1002 number of data sets
1100 probability
1214 histogram with only noise
1216 histogram with noise plus MR signal

The invention claimed is:

1. An instrument comprising:
a radio-frequency antenna comprising multiple antenna elements;
a radio-frequency system comprising independent receive channels for receiving a radio-frequency signal from each of the multiple antenna elements;
a memory containing machine executable instructions;
a processor for controlling the instrument, wherein execution of the machine executable instructions causes the processor to:
control the radio-frequency system to receive the radio frequency signal from each of the multiple antenna elements;
extract a noise signal from the radio frequency signal from each of the multiple antenna elements;
calculate a normed signal for each noise signal by applying a mathematical norm to each noise signal;
calculate a covariance of the normed signal between each of the multiple antenna elements;
calculate a motion signal by summing each covariance of the normed signal; and
detect motion of a subject by detecting a motion event in the motion signal wherein execution of the machine executable instructions further cause the processor to detect motion of a subject at least partially by detecting a motion event in the motion signal by:
calculate a motion probability by comparing each value of the motion signal to a probability function; and
identify if the motion probability is above a predetermined probability.

2. An instrument being a magnetic resonance imaging system, comprising:
a radio-frequency antenna comprising multiple antenna elements for acquiring magnetic resonance data;

a radio-frequency system comprising independent receive channels for receiving a radio-frequency signal representing magnetic resonance data from each of the multiple antenna elements a memory containing machine executable instructions;

a processor for controlling the instrument, wherein execution of the machine executable instructions causes the processor to:

cause the processor to acquire magnetic resonance data by controlling the magnetic resonance imaging system with pulse sequence commands;

control the radio-frequency system to receive the radio frequency signal from each of the multiple antenna elements;

extract a noise signal from the radio frequency signal from each of the multiple antenna elements;

calculate a normed signal for each noise signal by applying a mathematical norm to each noise signal;

calculate a covariance of the normed signal between each of the multiple antenna elements;

calculate a motion signal by summing each covariance of the normed signal; and detect motion of a subject by detecting a motion event in the motion signal, and wherein execution of the machine executable instructions cause the processor to extract the noise signal from the radio frequency signal from each of the multiple antenna elements by:

calculating a Fourier transform of the the magnetic resonance data in a frequency encoding direction;

identifying a noise area in the Fourier transformed magnetic resonance data;

construct a histogram of the Fourier transformed magnetic resonance data in the noise area;

fitting a probability distribution to the histogram; and generating the noise signal by calculating a fitting measure of the fit of the probability distribution to the histogram.

3. The instrument of claim 1, wherein each of the multiple antenna elements has a bandwidth, wherein the memory further contains a digital filter algorithm for each of the multiple antenna elements that functions as an inverse function to the bandwidth, wherein execution of the instructions further cause the processor to apply the digital filter to the radio frequency signal before or while processing the radio frequency signal into the noise signal.

4. The instrument of claim 1, wherein execution of the machine executable instructions further cause the processor to set portions of each covariance of the normed signals to zero that are below a predetermined threshold before calculating the motion signal.

5. The instrument of claim 1, wherein execution of the machine executable instructions further cause the processor to apply a weighting factor to each of the covariance of the normed signals before calculating the motion signal.

6. The instrument of claim 1, wherein execution of the machine executable instructions causes the processor to normalize each normed signal using a mean value before calculating the motion signal.

7. The instrument of claim 1, wherein execution of the machine executable instructions further cause the processor to detect motion of a subject at least partially by detecting a motion event in the motion signal by identifying portions of the motion signal above a predetermined value.

8. The instrument of claim 2, wherein execution of the machine executable instructions cause the processor to extract the noise signal for the radio frequency signal from each of the multiple antenna elements by applying a high pass filter to the magnetic resonance data for each of the multiple antenna elements.

9. The instrument of claim 1, wherein each noise signal is real valued, wherein the mathematical norm is any one of the following: an absolute value, a square of the noise signal, a root mean square of the noise signal over a predetermined time, and a real valued width parameter of a probability distribution function describing the distribution of the noise signal.

10. The instrument of claim 1, wherein each noise signal is complex valued, wherein the mathematical norm is any one of the following: the Euclidian norm, a vector length, a square of the vector length, a root mean square of the noise signal over a predetermined time, a root means square of the vector length over the predetermined time, a width parameter of a probability distribution function describing the distribution of the noise signal, and a width parameter fit to a histogram of the noise signal.

11. A method of operating an instrument, wherein the instrument comprises a radio-frequency antenna comprising multiple antenna elements, wherein the instrument further comprises a radio-frequency system comprising independent receive channels for receiving a radio-frequency signal from each of the multiple antenna elements, wherein the method comprises the steps of: controlling the radio-frequency system to receive the radio frequency signal from each of the multiple antenna elements; extracting a noise signal from the radio frequency signal from each of the multiple antenna elements; calculating a normed signal for each noise signal by applying a mathematical norm to each noise signal; calculating a covariance of the normed signal between each of the multiple antenna elements; calculating a motion signal by summing each covariance of the normed signal; and detecting motion of a subject by detecting a motion event in the motion signal by calculating a motion probability by comparing values of at least a portion of the motion signal to a predetermined function to determine the motion probability.

12. The method of claim 11, wherein prior to calculating the the motion signal at least one operation from the following set of operations are performed: setting portions of each covariance of the normed signals to zero that are below a predetermined threshold before calculating the motion signal, applying a weighting factor to each of the covariance of the normed signals before calculating the motion signal, or normalizing each normed signal using a mean value before calculating the motion signal.

13. The method of claim 11, wherein detecting motion of a subject at least partially includes detecting the motion event in the motion signal by identifying portions of the motion signal above a predetermined value.

14. The method of claim 11, wherein extracting the noise signal for the radio frequency signal from each of the multiple antenna elements includes applying a high pass filter to the magnetic resonance data for each of the multiple antenna elements.

15. A computer program product comprising machine executable instructions stored on non-transitory computer readable medium for execution by a processor controlling an instrument, wherein the instrument comprises a radio-frequency antenna comprising multiple antenna elements, wherein the instrument further comprises a radio-frequency system comprising independent receive channels for receiving a radio-frequency signal from each of the multiple antenna elements, wherein execution of the machine executable instructions causes the processor to:

control the radio-frequency system to receive the radio-frequency signal from each of the multiple antenna elements;

extract a noise signal from the radio frequency signal from each of the multiple antenna elements;

calculate a normed signal for each noise signal by applying a mathematical norm to each noise signal;

calculate a covariance of the normed signal between each of the multiple antenna elements;

calculate a motion signal by summing each covariance of the normed signal; and detect motion of a subject by detecting a motion event in the motion signal wherein execution of the machine executable instructions further cause the processor to detect motion of a subject at least partially by detecting a motion event in the motion signal by:

calculate a motion probability by comparing each value of the motion signal to a probability function; and identify if the motion probability is above a predetermined probability.

16. The computer program product of claim 15, wherein execution of the machine executable instructions further cause the processor to perform at least one of from the group of: setting portions of each covariance of the normed signals to zero that are below a predetermined threshold before calculating the motion signal, applying a weighting factor to each of the covariance of the normed signals before calculating the motion signal, or normalizing each normed signal using a mean value before calculating the motion signal.

17. The computer program product of claim 15, wherein execution of the machine executable instructions cause the processor to extract the noise signal for the radio frequency signal from each of the multiple antenna elements by applying a high pass filter to the magnetic resonance data for each of the multiple antenna elements.

* * * * *